(12) United States Patent
Kanjanavikat

(10) Patent No.: US 6,381,016 B1
(45) Date of Patent: Apr. 30, 2002

(54) LEAD WIDTH INSPECTION SYSTEM AND METHODS

(75) Inventor: Adisorn Kanjanavikat, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/616,524

(22) Filed: Jul. 14, 2000

(51) Int. Cl.$^7$ .............................................. G01B 11/00
(52) U.S. Cl. .................... 356/397; 33/201; 359/801; 359/804
(58) Field of Search ................... 356/388, 394, 356/397; 359/801, 804, 646, 439, 726; 33/201, 11; 382/8, 34, 146; 348/126, 87

(56) References Cited

U.S. PATENT DOCUMENTS

| | | | | |
|---|---|---|---|---|
| 3,398,631 A | * | 8/1968 | McGivern et al. | 356/397 |
| 4,078,864 A | * | 3/1978 | Howell | 356/241 |
| 4,172,662 A | * | 10/1979 | Vogel | 356/397 |
| 4,855,928 A | * | 8/1989 | Yamanaka | 364/489 |
| 5,155,556 A | * | 10/1992 | Foanio | 356/397 |
| 5,485,398 A | * | 1/1996 | Yamazaki et al. | 382/146 |
| 5,933,239 A | * | 8/1999 | Hoshiyama | 356/397 |

* cited by examiner

Primary Examiner—Hoa Q. Pham
(74) Attorney, Agent, or Firm—Eschweiler & Associates, LLC

(57) ABSTRACT

A leadframe inspection system, methods, and templates are provided. The leadframe inspection templates include upper and lower specification limits marks that form lead width guides. A user places a leadframe on the template, lines up the leads on the leadframe with an alignment mark, and examines the lead width in relation to the specification limits marked on the lead inspection template. The templates may be placed in the eye piece of a microscope, and thus provide a single instrument for rapidly inspecting lead widths.

9 Claims, 18 Drawing Sheets

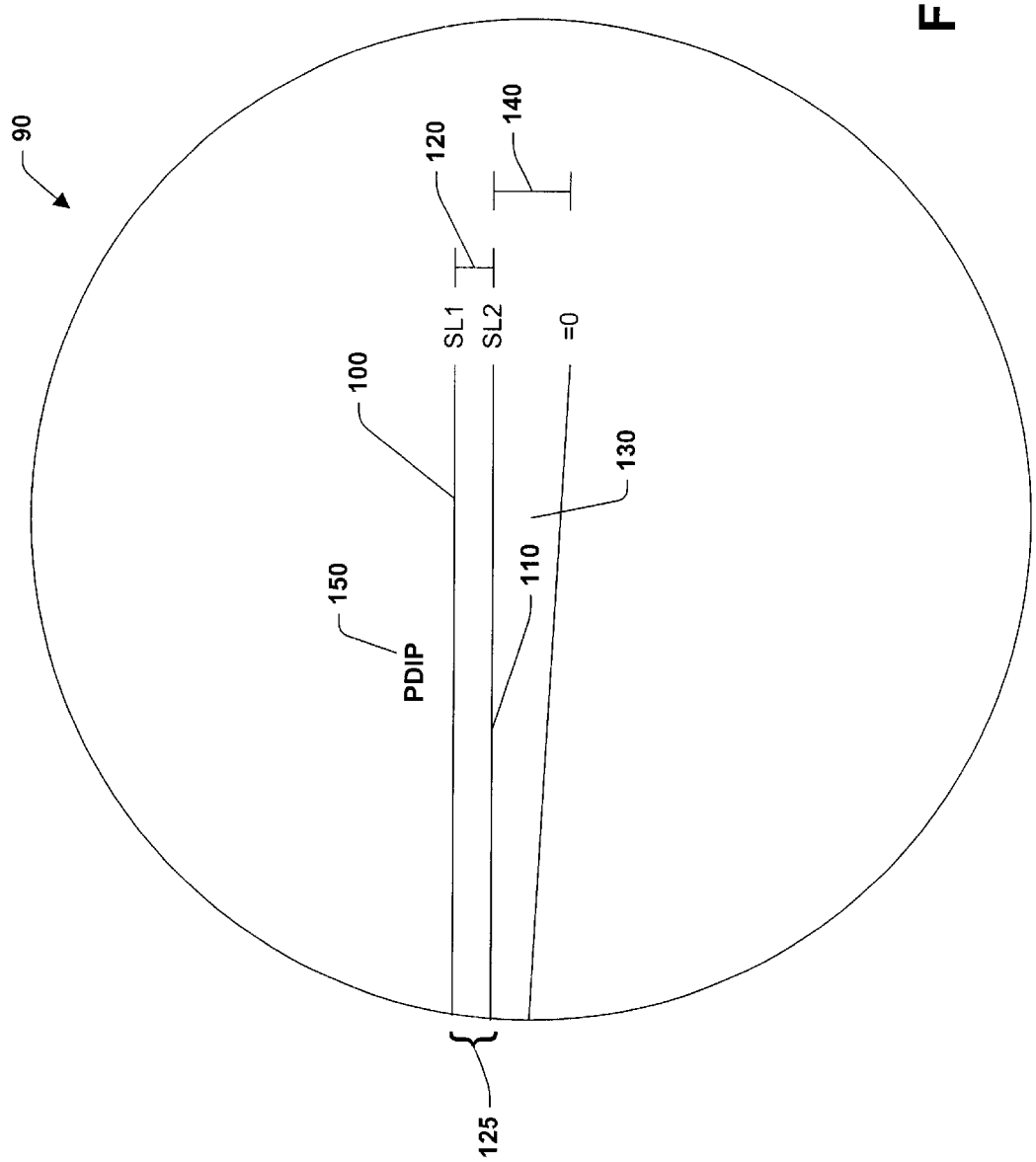

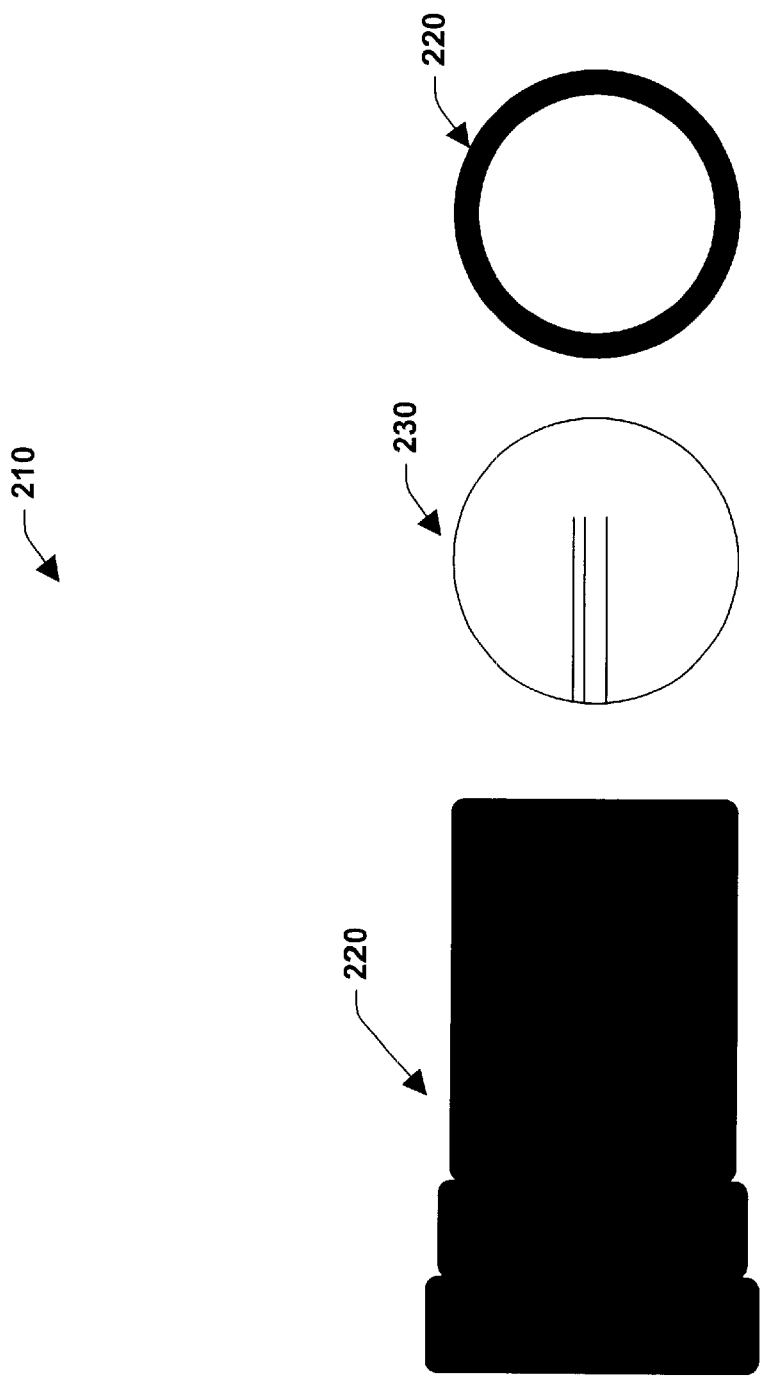

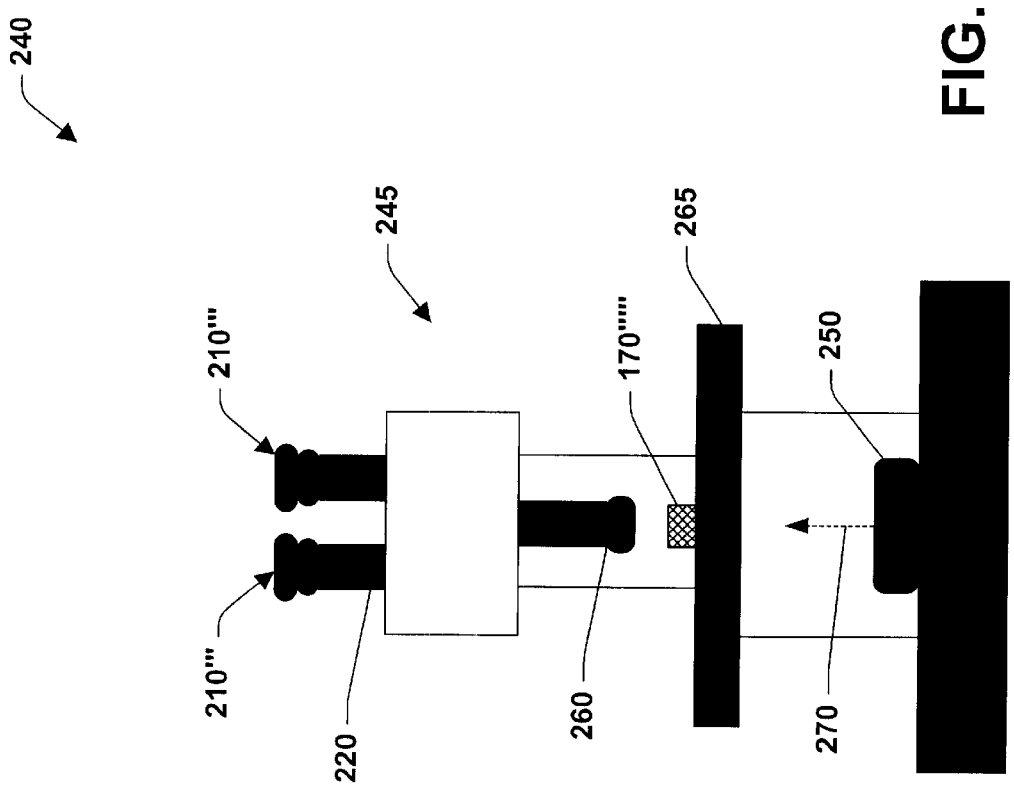

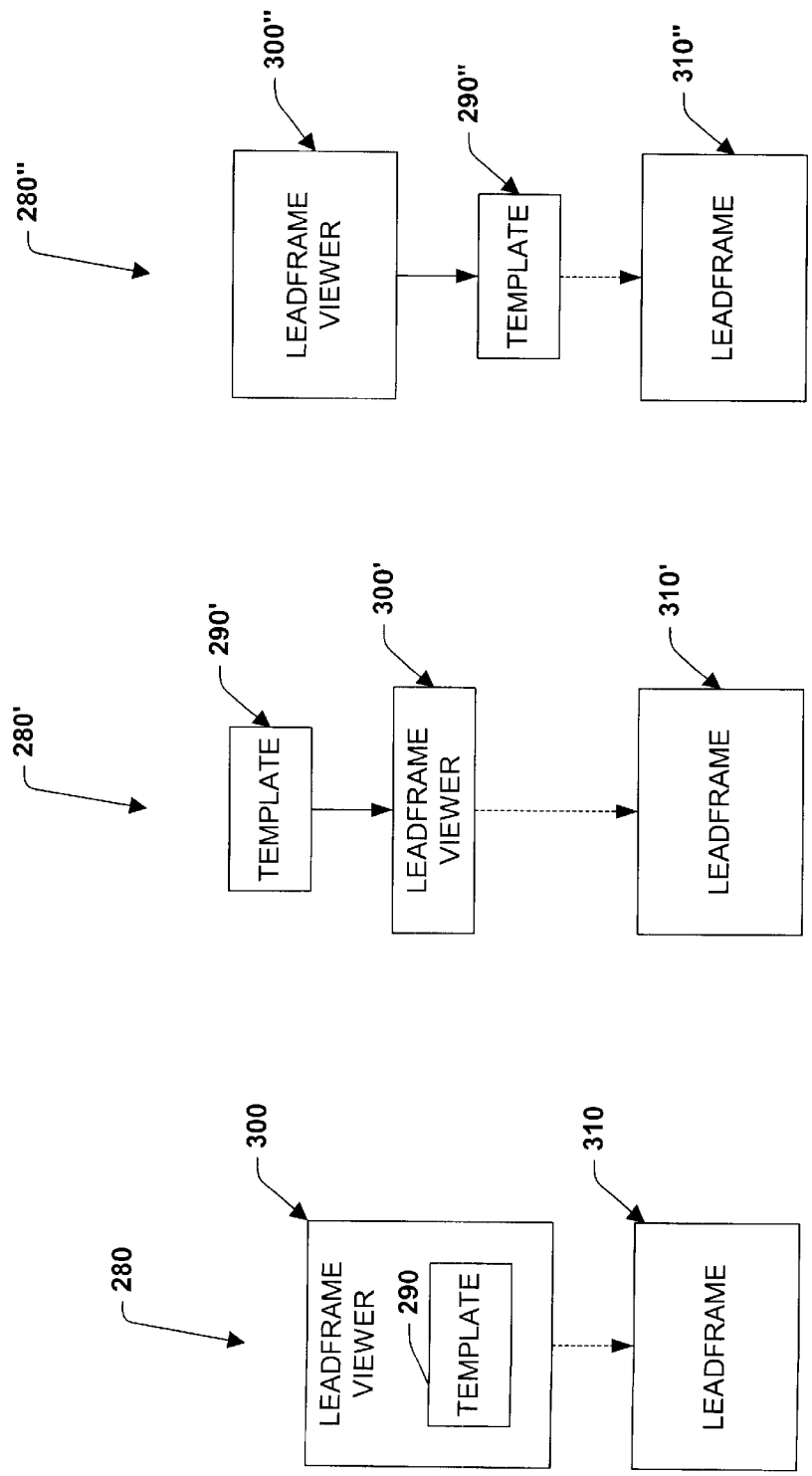

LEAD WIDTH INSPECTION SYSTEM AND METHODS

BACKGROUND OF THE INVENTION

Semiconductor devices are generally packaged in an integrated circuit (IC) package. A typical IC package 10 is shown in FIG. I. The IC package 10 consists of a leadframe 20 and a die 30 encapsulated in a housing 40, such as molded plastic or resin. The leadframe 20 includes a support, called a die pad 50, on which the die 30 is mounted, and a plurality of leads 60 electrically coupled to the die 30. The leads 60 are connected to bond pads 70 on the die 30 via wire bonds 80. The leads 60 electrically connect the die 30 to the circuitry external to the package (not shown).

During packaging, a bonding material is used to adhere the die 30 to the die pad 50, and wires 80 are bonded to electrically couple the leads 60 of the leadframe 20 to the bond pads 70 on the die 30. Then the leadframe 20 and die 30 assembly is placed in a mold, and a molten insulating material, such as plastic resin, is added to the mold and cured. The result is an IC package that consists of the die 30 and a portion of the leadframe 20 encapsulated in insulating housing 40, such that the end portions of the leads 60 extend from the housing 40.

During IC package manufacturing, the leadframes typically are inspected to ensure that the lead widths are acceptable. Lead width inspection is a quality control activity that involves measuring the width of the leads and comparing the measured lead widths to predetermined specifications. One method of inspecting a lead frame entails placing the IC packages under a microscope, measuring the lead widths, and comparing the measurements to the pre-determined specification limits. If a lead width is within the range of the specification limits, then it is deemed acceptable. If a lead width is not within the range of the specification limits, then it is rejected. This process requires a skilled operator, up to 5 minutes or more per inspection, and is susceptible to errors in the readings. Thus, the current systems and methods of lead width inspection is labor intensive, prone to inaccuracies, and slow. Systems and methods of improving the speed, accuracy and simplicity of lead width inspection are needed.

SUMMARY OF THE INVENTION

The present invention comprises lead inspection systems, methods, and templates. The templates include upper and lower specification limits marked on the template to form a lead width guide. To inspect a leadframe, a user places a leadframe on the template, lines up the leads on the leadframe with an alignment mark, and looks to see if the leads fall within the lead width guide marked on the template. If the leads fall within the lead width guides, then the lead width is acceptable. If the leads do not fall within the lead width guides, the lead width is unacceptable. Because of the small size of the leadframes, typically, the leadframe is inspected with a microscope. The templates may be placed in the eye piece of a microscope, and provide a single instrument for rapidly inspecting lead widths. Since the templates replace the error prone and tedious task of measuring the lead widths with a simple visual inspection, the systems and methods of the present invention improve the speed, accuracy, and simplicity of lead width inspection, thus, overcoming the limitations and shortcomings of the prior art.

In accordance with one aspect of the present invention a template for inspecting leadframes is provided. The template includes a first specification limit and a second specification limit. The first specification limit is positioned a distance from the second specification limit so as to form a lead width guide therebetween. The template may further include an alignment mark positioned a second distance from the lead width guide so as to provide a guide for aligning a portion of the leadframe with the lead width guide. The template may be a substantially optically clear material with the first and second specification limits indicated by dark lines on the substantially optically clear material. The clear material may be any substantially optically clear material, such as plastic or glass. The template may be coupled to a leadframe viewer, such as an eyepiece of a microscope, forming a leadframe viewing assembly.

The microscopes utilized in the present invention include those microscopes capable of 3- inspection. The present invention may be utilized to inspect the leadframes of any type of IC package, such as plastic dual in-line packages, small outline packages, plastic leaded chip carriers, quad flat packages, or any other type of IC packages. The templates of the present invention may have one or a plurality of lead width guides associated therewith.

In accordance with another aspect of the invention, a system for inspecting a leadframe is provided. The system may include an imaging device, such as a microscope, and a template. The template may be coupled to the imaging device so as to produce an image of the template, for instance by coupling the template to at least one eyepiece of the microscope. The template may have one or more lead width guides formed by a first specification limit positioned a distance from a second specification limit. The template may further include one or more alignment marks positioned a second distance from a corresponding lead width guide so as to provide a guide for aligning a portion of the leadframe with the lead width guide. The template may be a substantially optically clear material with the first and second specification limits indicated by dark lines on the substantially optically clear material. The clear material may be any substantially optically clear material, such as plastic or glass.

In accordance with yet another aspect of the present invention, a method for inspecting a leadframe is provided. The method includes providing a template, imaging one or more portions of the leadframe and the template, and comparing the one or more portions of the leadframe to the one or more lead width guides of the template. The template may be coupled to an eyepiece of the microscope, and the template and the one or more portions of the leadframe may be imaged by a microscope. The one or more portions of the leadframe may be compared to the one or more lead width guides by visual inspection. The method may further include determining if the one or more portions of the leadframe are of an acceptable width.

The template may have one or more lead width guides formed by a first specification limit and a second specification limit. The template may further include one or more alignment marks positioned a second distance from a corresponding lead width guide so as to provide a guide for aligning a portion of the leadframe with the lead width guide. The template may be a substantially optically clear material with the first and second specification limits indicated by dark lines on the substantially optically clear material. The clear material may be any substantially optically clear material, such as plastic or glass.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages, and novel features of the invention will become apparent from the following detailed description of the invention when considered in conjunction with the drawings.

BRIEF DESCRIPTION OF THE DRAWINGS

FIG. 2a is a plan view illustrating a template in accordance with an exemplary aspect of the present invention;

FIG. 4a is an illustration of a leadframe viewing assembly in accordance with the present invention;

FIG. 4c is an illustration of a leadframe inspection system in accordance with the present invention;

FIG. 5a is a block diagram of a leadframe viewing assembly in accordance with the present invention;

FIG. 5b is a block diagram of a leadframe viewing assembly in accordance with the present invention;

FIG. 5c is a block diagram of a leadframe viewing assembly in accordance with the present invention;

DETAILED DESCRIPTION OF THE INVENTION

Figure 1:
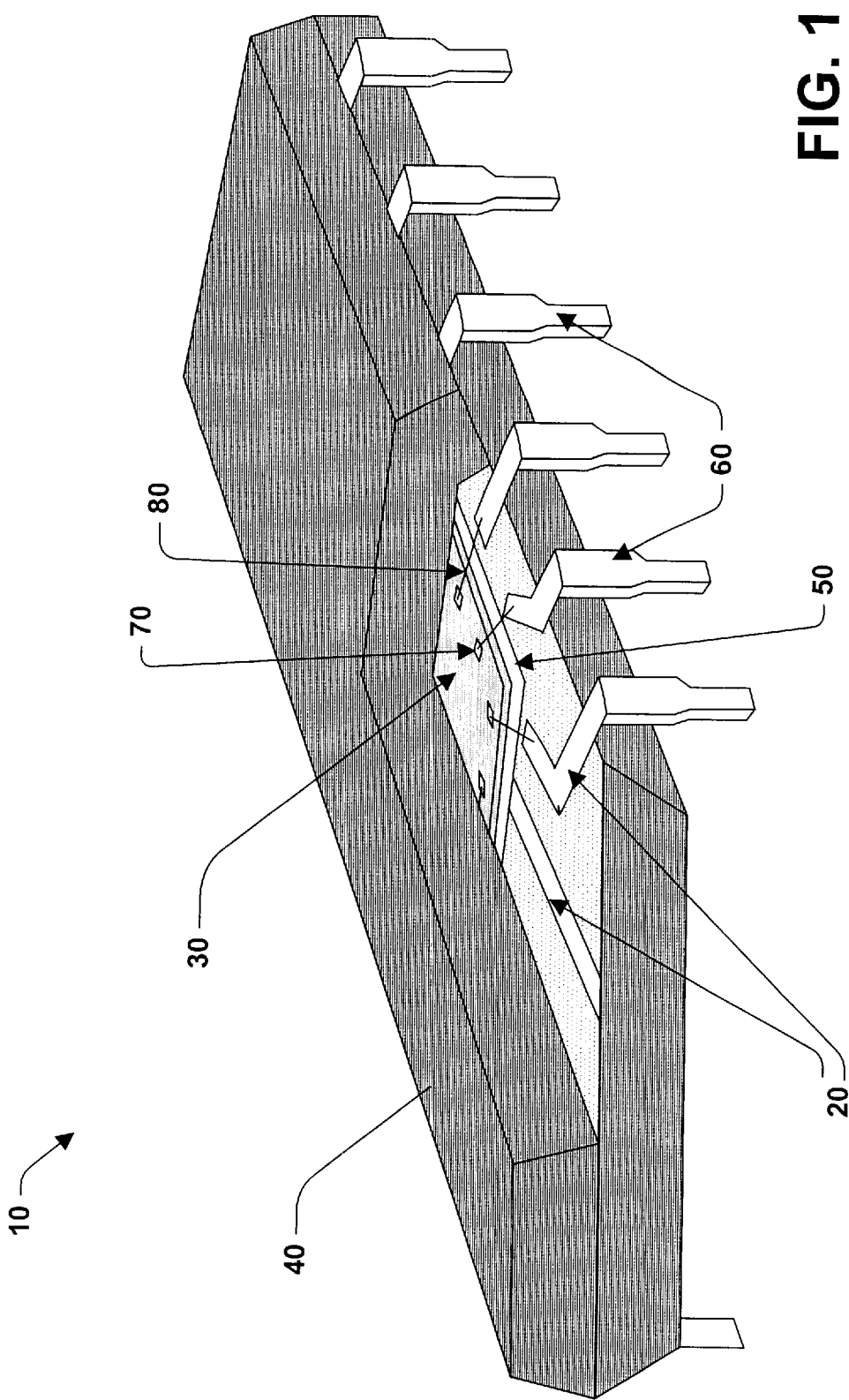
FIG. 1 is a perspective view of an integrated circuit package encasing a die and leadframe.

The following is a detailed description of the present invention made in conjunction with the attached figures, wherein like reference numerals will refer to like elements throughout. The invention provides leadframe inspection systems and methods capable of viewing a leadframe in relation to a leadframe inspection template. The leadframe inspection system may include a microscope and a template associated with the eyepiece of the microscope. The template may have marks indicating the upper and lower specification limits for the lead widths. Viewing the leadframe in relation to the template allows a user to rapidly inspect lead widths. The leadframe can be viewed either before or after packaging the IC.

Referring now to the figures, several aspects of the present invention are presented. In FIG. 2a, one example of a leadframe inspection template 90 is shown. The leadframe inspection template 90 has a first specification limit mark 100 ("SL1") and a second specification limit mark 110 ("SL2) separated by a distance 120. The first specification mark 100 and the second specification mark 110 and the distance 120 therebetween graphically represent the lead width specification limits. Together the first specification mark 100 and the second specification mark 110 separated by a distance 120 form the lead width guide, as indicated by the bracket 125 in the drawing.

The template may also include a third mark, the alignment mark 130 ("=0"), for aligning a portion of the leadframe with the lead width guide 125. The alignment mark 130 is located a second distance 140 from the second specification limit 110. The alignment mark 130 may be placed in any spatial relationship to the specification limits 100 and 100 so as to facilitate the spatial orientation of the leadframe to the lead width guide 125. Although only one alignment mark 130 is shown in the drawing, the templates of the present invention may have more than one alignment mark, including five, ten or even more alignment marks. The alignment marks may be in any spatial relationship to each other, and in any spatial relationship to the specification marks 100 and 110.

Figure 2B:
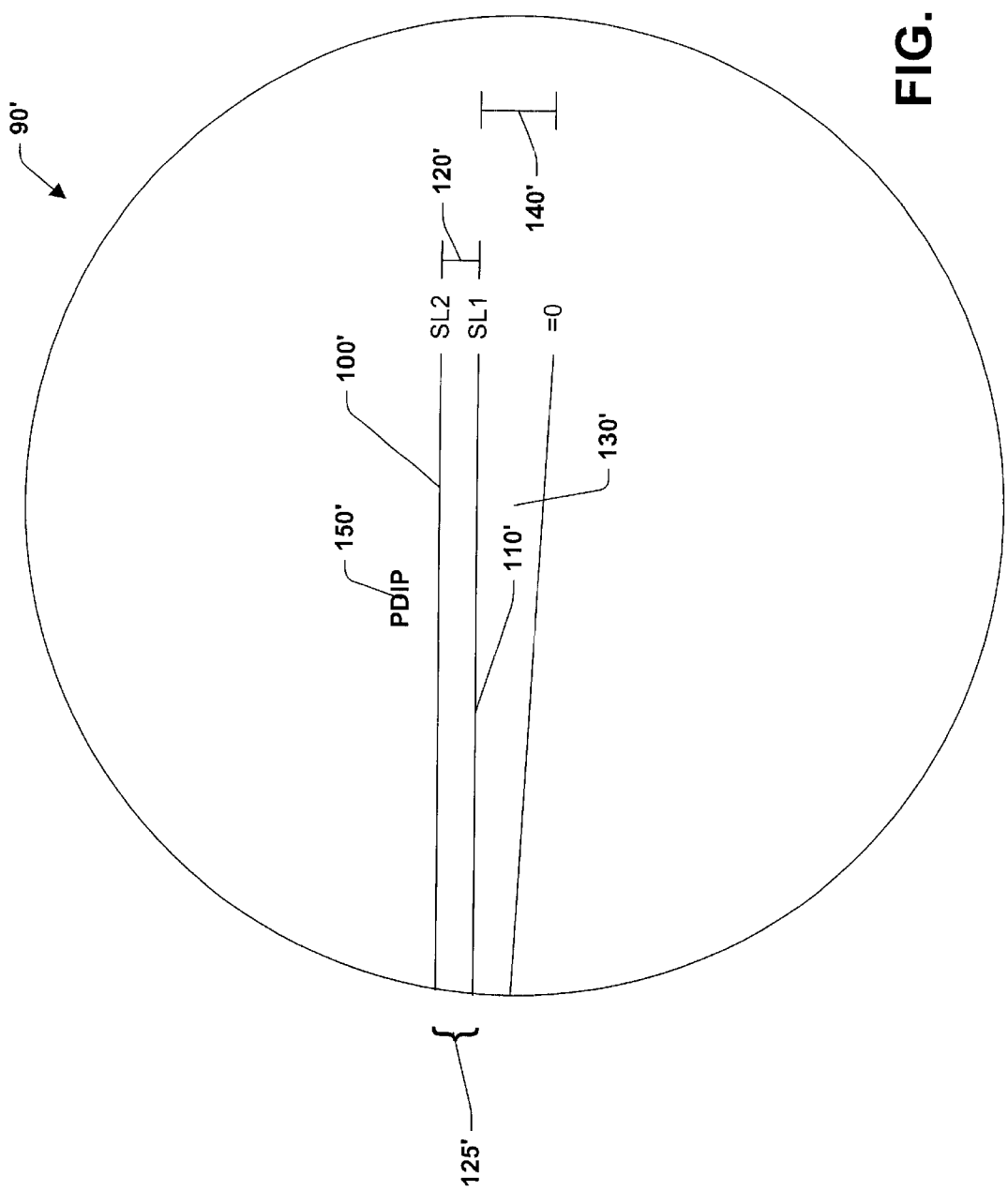
FIG. 2b is a plan view illustrating template in accordance with an exemplary aspect of the present invention.
Figure 2C:
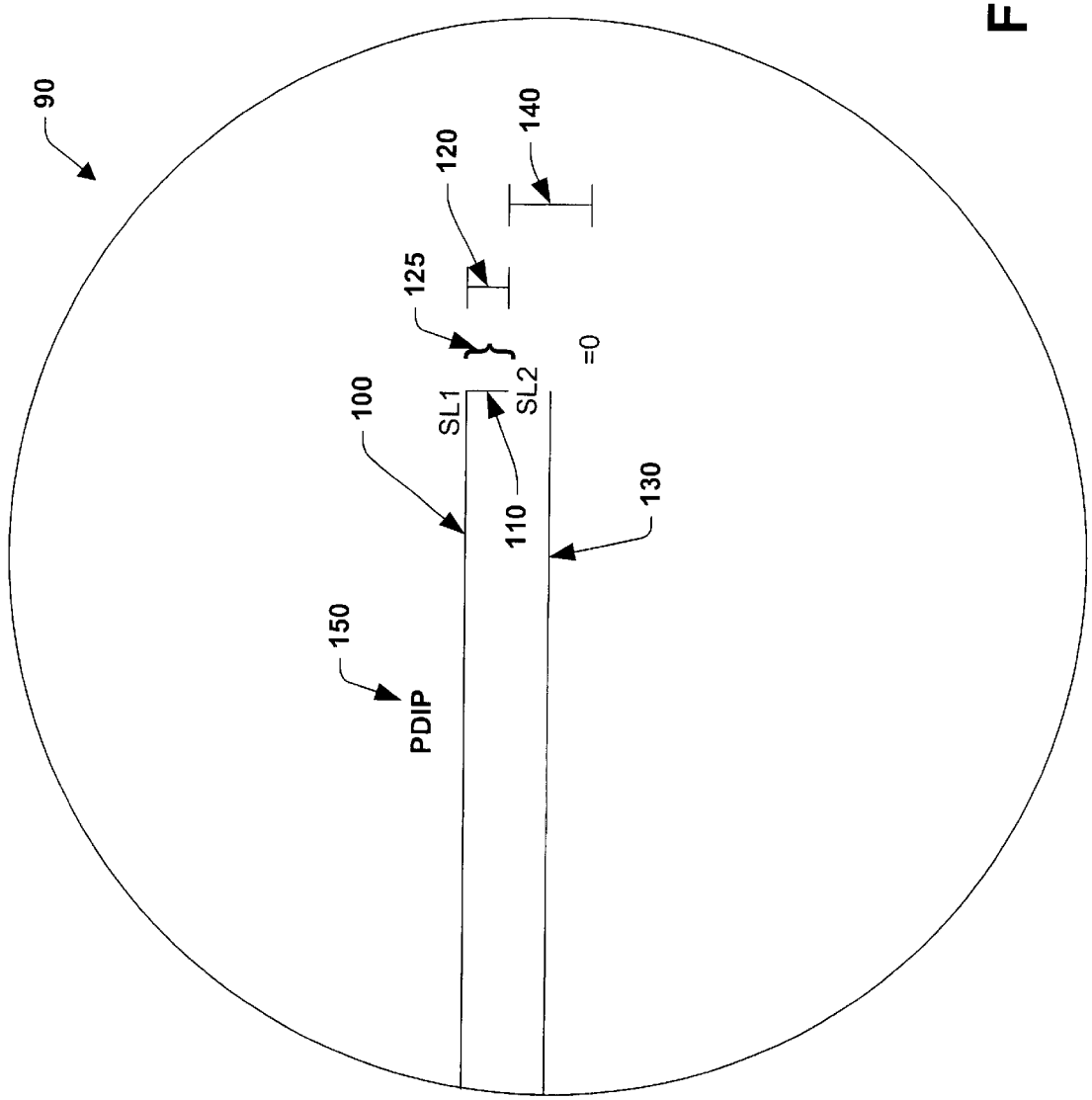
FIG. 2c is a plan view illustrating a template in accordance with an exemplary aspect of the present invention.

The type of leadframe for which the lead width guide 125 is to be used may be indicated on the template by a type mark 150. The second specification limit 100 may be below the first specification limit 100 as shown in FIG. 2a, or above the first specification limits 100 as shown in FIG. 2b. The first specification limit 100 and the second specification limit 110 may be in any spatial relationship to each other so as to form a lead width guide therebetween, for instance, as shown in FIG. 2c. Although the figures only show one first specification mark 100 and one second specification mark 110, the templates of the present invention may have more than one first and second specification marks, including five, ten, or even more first and second specification marks.

Figure 2D:
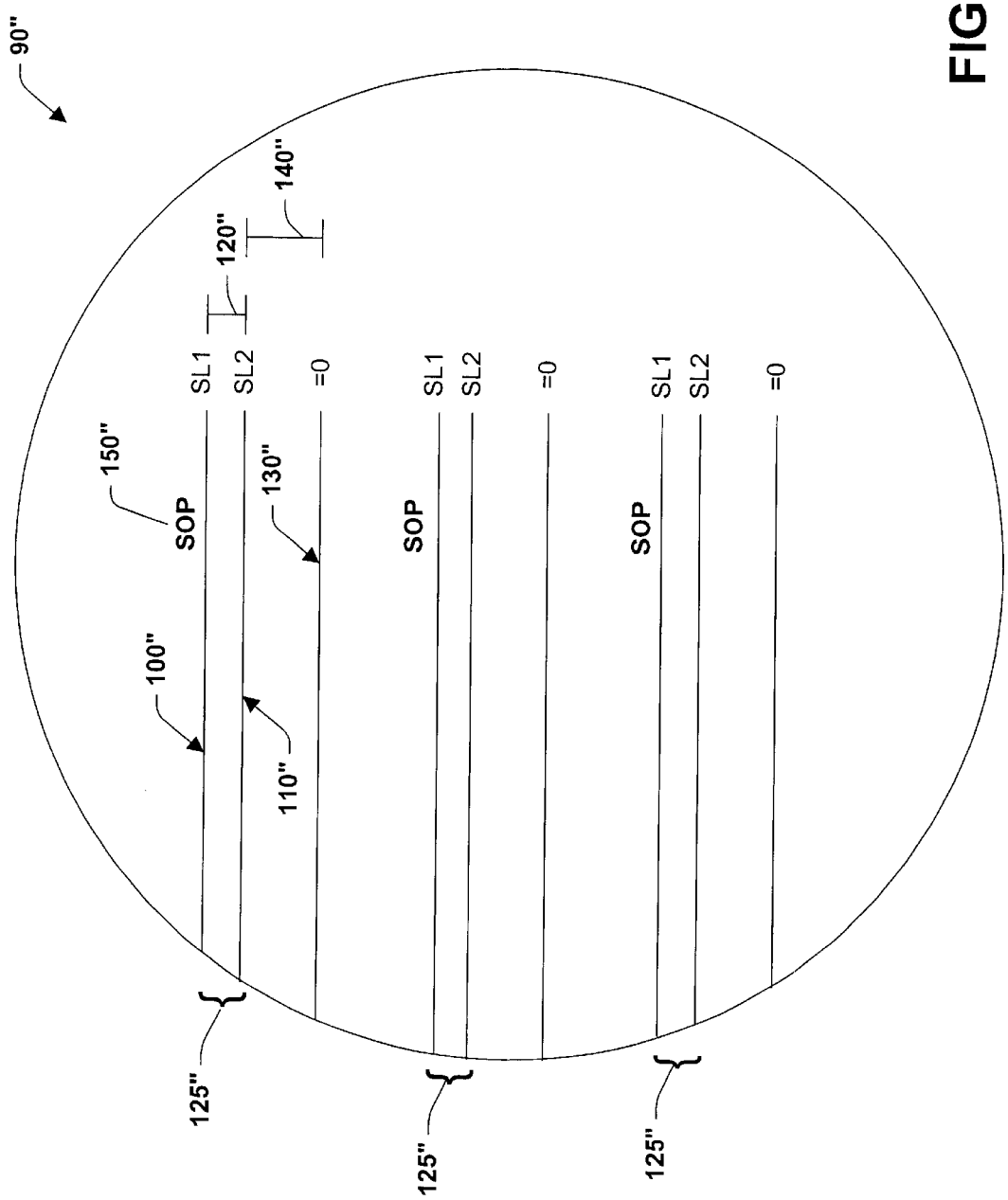
FIG. 2d is a plan view illustrating a template in accordance with an exemplary aspect of the present invention.
Figure 2E:
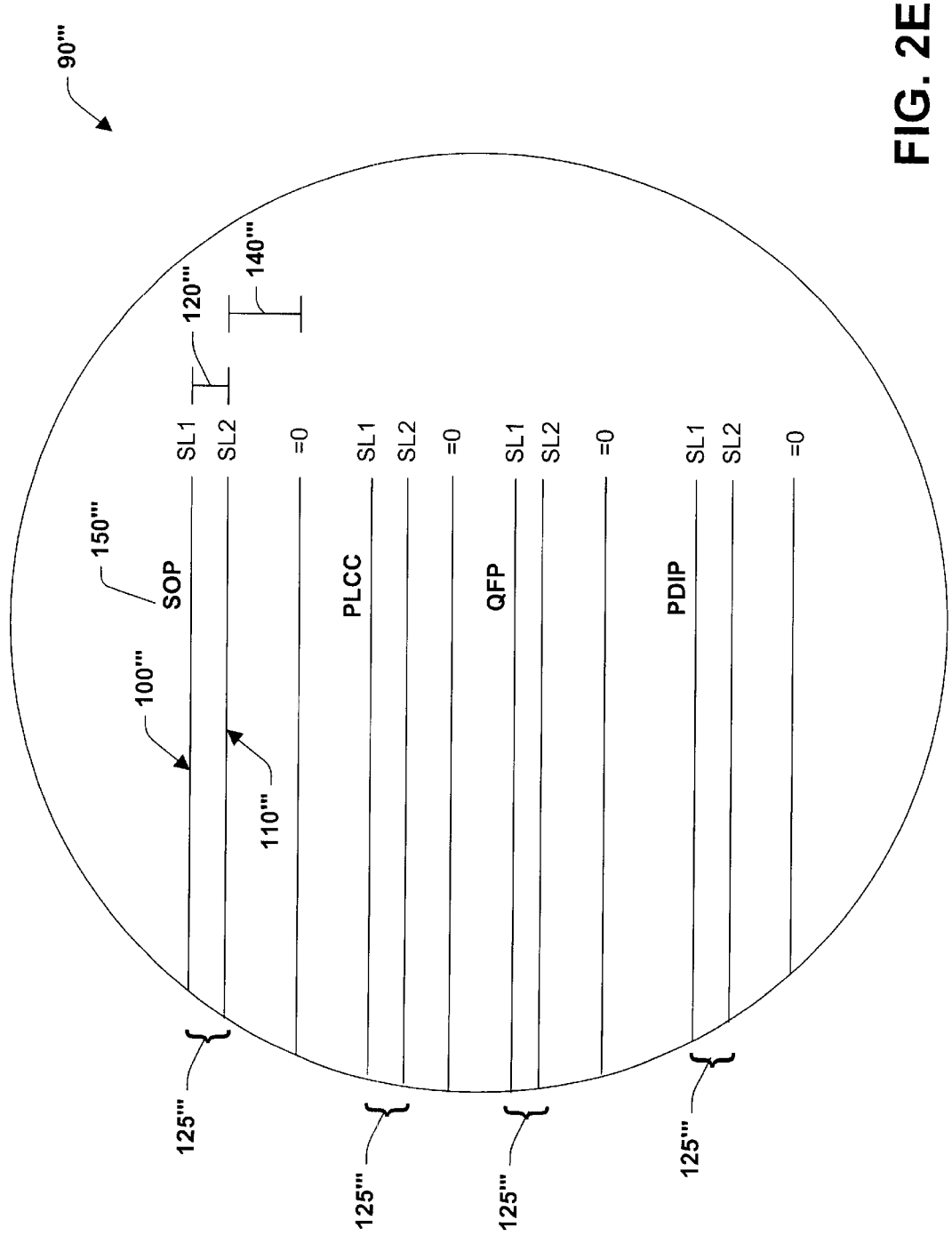
FIG. 2e is a plan view illustrating a template in accordance with an exemplary aspect of the present invention.

The templates of the present invention may have a single lead width guide, or a plurality of lead width guides as shown in FIGS. 2d and 2e. The plurality of lead width guides may be for one type of leadframe as shown in FIG. 2d, or for a plurality of types of leadframes as shown in FIG. 2e. The templates of the present invention may be made of a substantially optically clear plastic or glass or any other material suitable for viewing a leadframe. The template marks may be dark lines or any other mark suitable for indicating the lead width specification limits, alignment marks, and leadframe types. The present invention contemplates marks that are raised from, notched into, or flush with the surface of the template, or even formed within the material of the template.

Figure 3A:
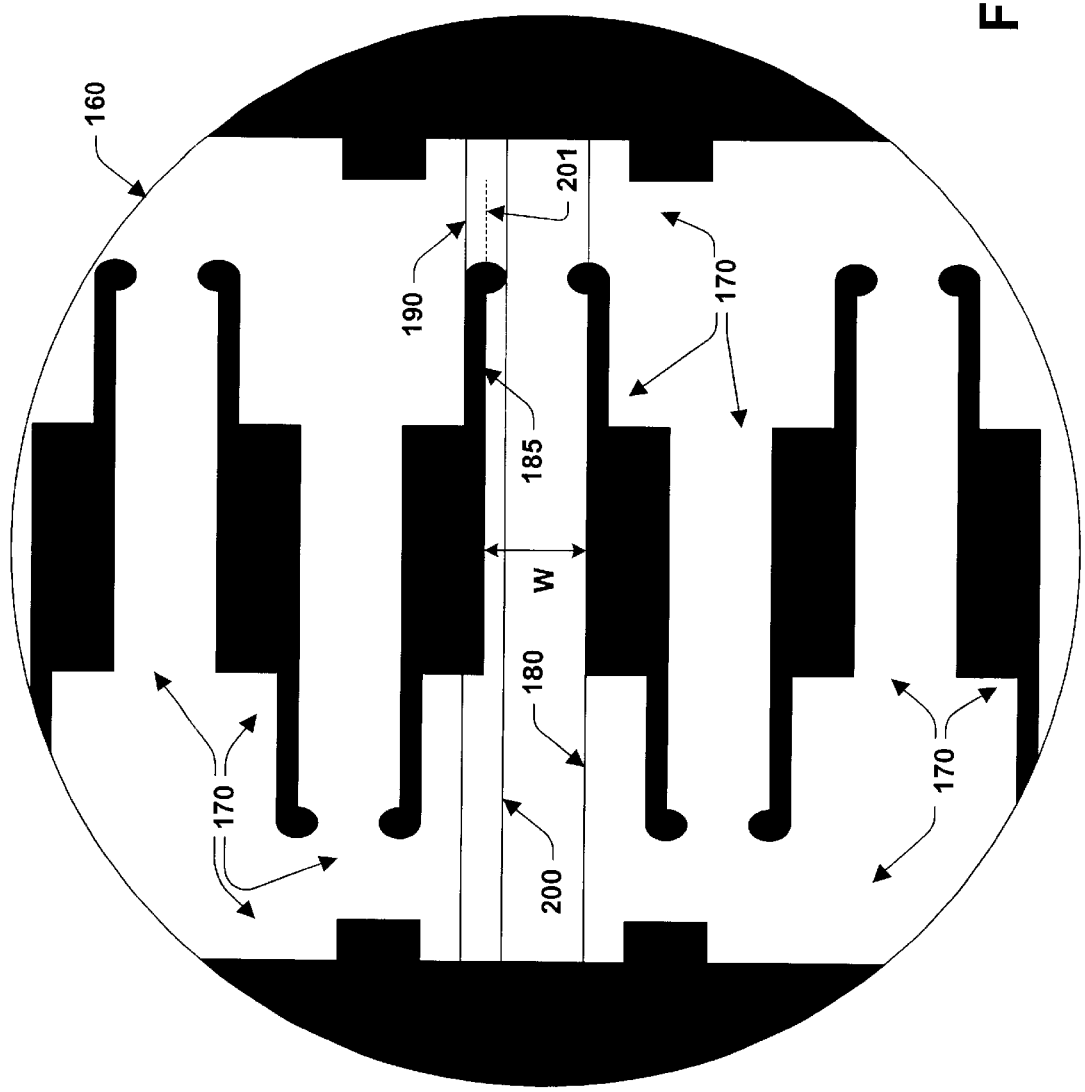
FIG. 3a is a plan view illustrating a template and a leadframe in accordance with the present invention.
Figure 3B:
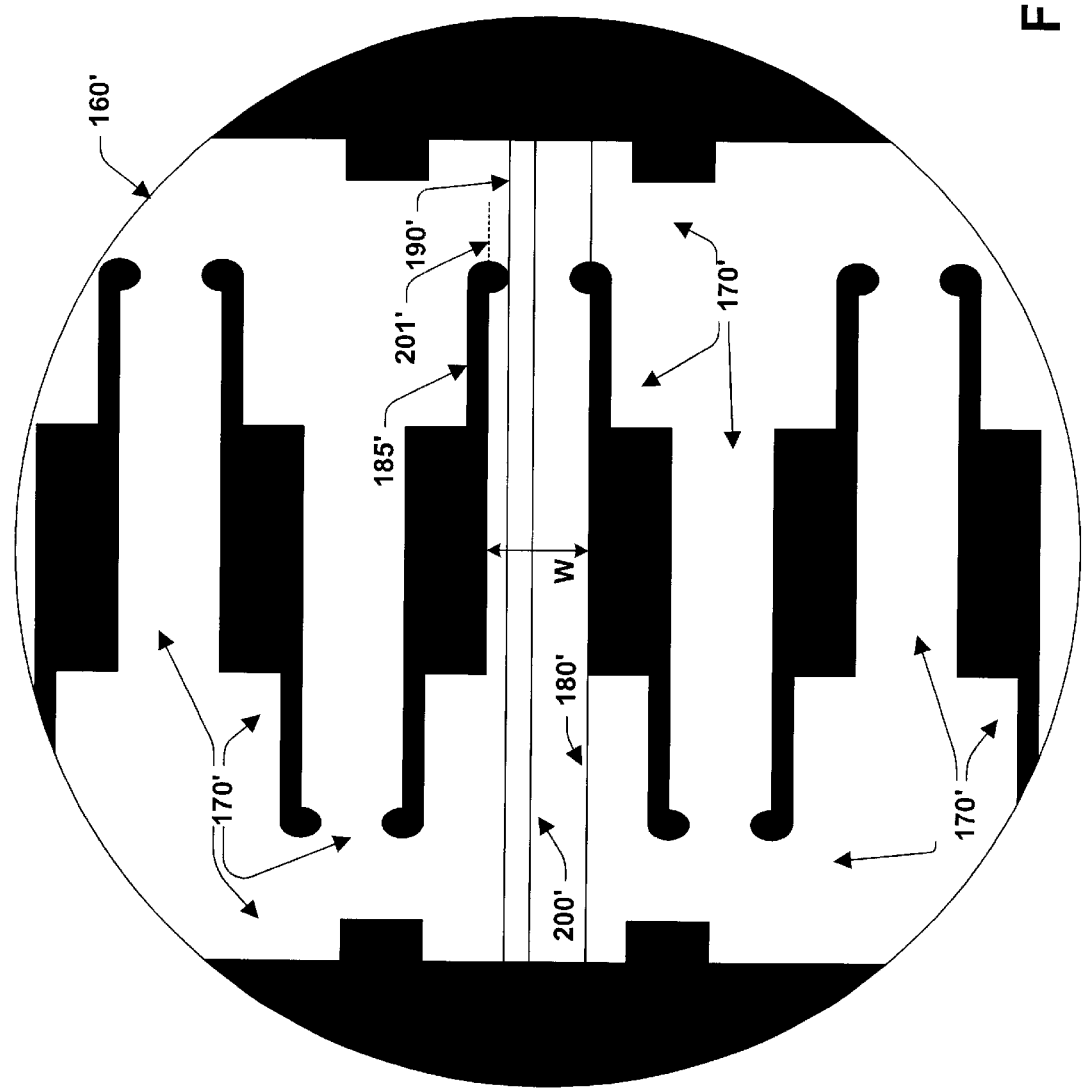
FIG. 3b is a plan view illustrating a template and a leadframe in accordance with the present invention.

Turning now to FIG. 3a, a template 160 and a leadframe portion 170 are shown, for example as viewed under a microscope. As viewed in FIG. 3a, the dark regions comprise gaps in the leadframe while the light regions comprise the leadframe portions which are coupled together prior to a trim process. In one aspect of the present invention, the leadframe 170 may be aligned with the template 160 using the alignment mark 180 as an alignment guide. The leadframe 170 may be inspected to determine the acceptability of the lead widths by examining the leadframe 170 in relation to the template 160. For instance, the leadframe 170 may be examined to determine if one or more portions 185 (representing a lead having a width "w") of the leadframe 170 fall within the first specification mark 190 and the second specification mark 200. If one or more portions 185 do fall within the specification marks 190 and 200 as shown by the dotted line 201 in FIG. 3a, then the lead width "w" would be judged acceptable. FIG. 3b shows a leadframe 170' in which one or more portions 185' (a lead having a width "w") of the leadframe 170' fall outside of the first specification mark 190' and the second specification mark 200' as illustrated by the dotted line 201'. In one aspect of the present invention, such a leadframe 170' would be judged unacceptable.

Figure 3C:
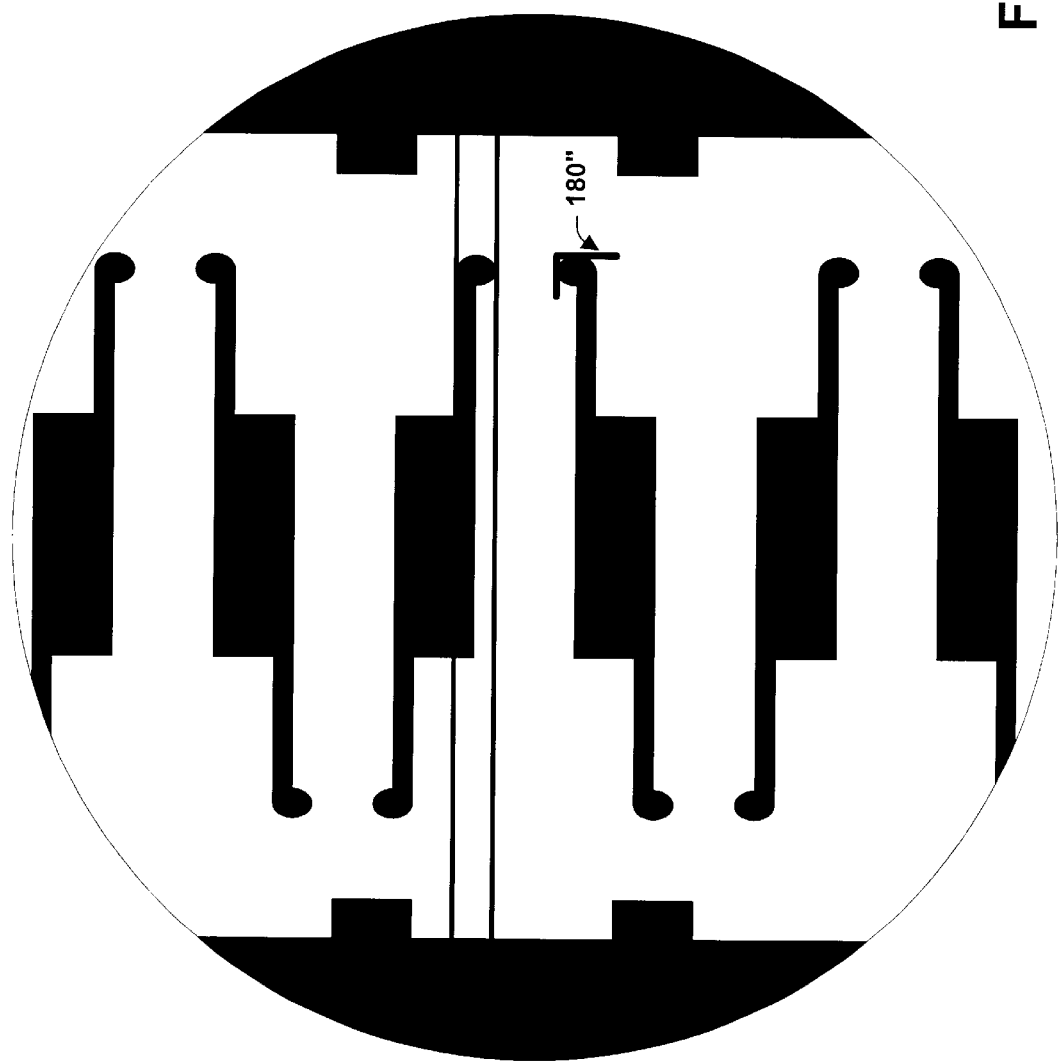
FIG. 3c is a plan view illustrating a template and a leadframe in accordance with the present invention.
Figure 3D:
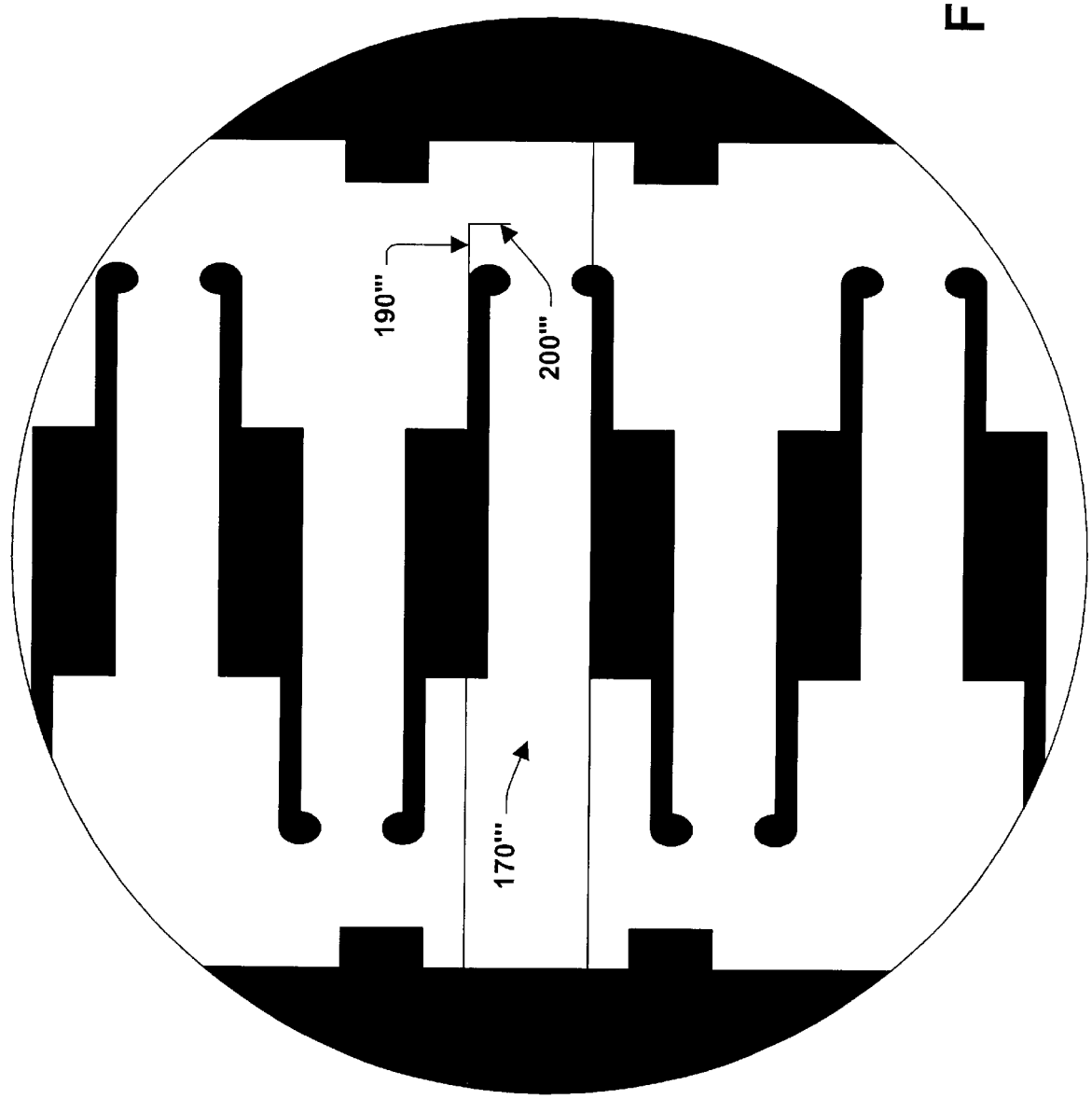
FIG. 3d is a plan view illustrating a template and a leadframe in accordance with the present invention.
Figure 3E:
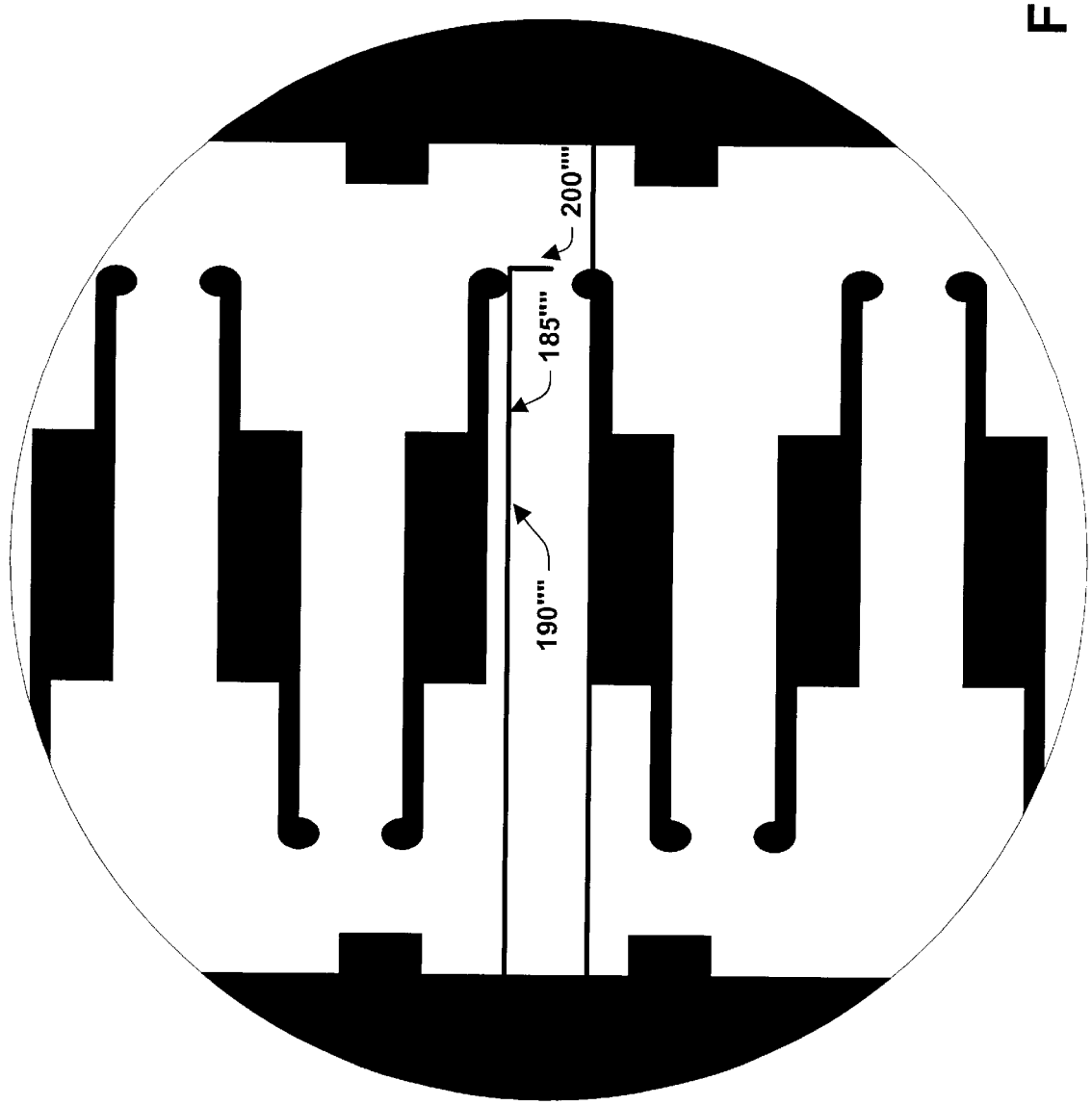
FIG. 3e is a plan view illustrating a template and a leadframe in accordance with the present invention.

FIG. 3c shows another example of an alignment mark 180'' in accordance with the present invention. FIGS. 3d and 3e show another example of a first specification mark 190''' and 190'''', and a second specification mark 200''' and 200'''' in accordance with the present invention. The leadframe 170''' of FIG. 3d falls within the specification marks 190''' and 200''', and would be judged acceptable. The lead edge 185'''' shown in FIG. 3e, does not fall within the specification marks 190'''' and 200'''' and would be judged unacceptable.

Figure 4B:
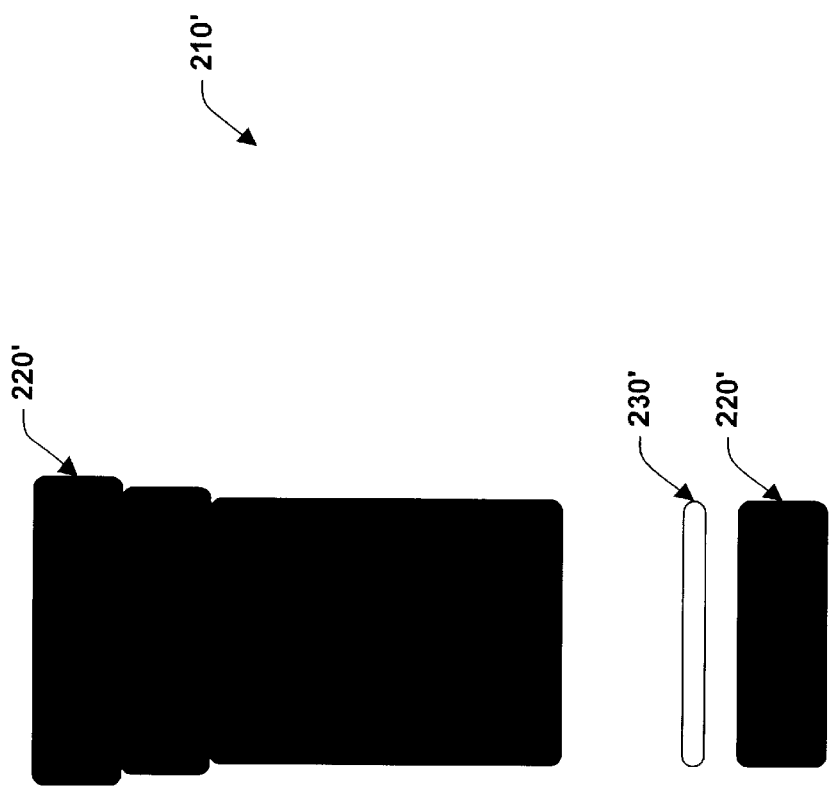
FIG. 4b is an illustration of a leadframe viewing assembly in accordance with the present invention.

Referring now to FIG. 4a, a leadframe viewing assembly 210 in accordance with one aspect of the present invention is shown. The leadframe viewing assembly 210 includes a leadframe viewer 220 coupled to a leadframe inspection template 230. As shown in FIG. 4a, the leadframe viewer 220 may be an eyepiece of a microscope or ocular lens. The template 230 may be coupled to the eyepiece of the microscope 220, for instance, by inserting the template 230 into the eyepiece 220. FIG. 4b illustrates an example of how the template 230' could be coupled to the eyepiece of a microscope 220' to form a leadframe viewing assembly 210'.

FIG. 4c illustrates a leadframe inspection system 240 in accordance with the present invention. The leadframe inspection system 240 includes an imaging device and a template coupled to the imaging device. As shown in FIG. 4c, the imaging device may be a microscope 245, and more particularly, a microscope capable of 3-D inspection. The leadframe inspection system 240 includes one or more viewing assemblies 210'''. As shown in FIGS. 4a and 4b, the viewing assemblies 210''' may include a microscope eyepiece 220 coupled to a template 230. In addition to the one or more viewing assemblies 210''', the leadframe inspection system 240 may include a light source 250, and an objective lens 260. The light source 250 illuminates the leadframe 170'''', which sits on a microscope stage 265 (illumination indicated by a dashed arrow 270), and the lens in the objective 260 and the eyepiece 220 magnify the image of the leadframe. One or more of the viewing assemblies 210''' can contain a lead inspection template 230 as shown in FIGS. 4a and 4b. A user may thus visually perceive the leadframe in relation to the template by looking into the viewing assemblies 210'''.

Although the figures show a microscope and an eyepiece for imaging and viewing the leadframe, it will be appreciated that other forms of optical processing may be utilized in the present invention and that these other forms of optical processing are deemed to fall within the scope of the present invention. For instance, optical processing devices may be provided that reconstruct optical data obtained via an optical sensor in order to generate images, including 3-D images. The present invention contemplates using any viewing assemblies and imaging devices that are suitable for imaging and/or viewing a leadframe. It is to be appreciated that the present invention is not limited to imaging devices and viewing assemblies that utilize light. The present invention contemplates imaging devices and viewing assemblies of any type suitable for imaging and/or viewing a leadframe, for instance, a scanning electron microscope.

Referring now to FIGS. 5a, 5b, and 5c, various leadframe viewing assemblies 280, 280', and 280'' are shown. In one aspect of the present invention, the leadframe inspection template may be integral with, or fabricated on or in the leadframe viewer to form the leadframe viewing assembly. FIG. 5a shows a leadframe inspection template 290 coupled to a leadframe viewer 300, wherein the template 290 is contained inside of the leadframe viewer 300. FIG. 5b shows a template 290' coupled to a leadframe viewer 300', wherein the leadframe viewer 300' is positioned between the leadframe to be inspected 310' and the template 290'. FIG. 5c shows a template 290'' coupled to a leadframe viewer 300'', wherein the template 290'' is positioned between the leadframe to be inspected 310'' and the leadframe viewer 300''.

Figure 6C:
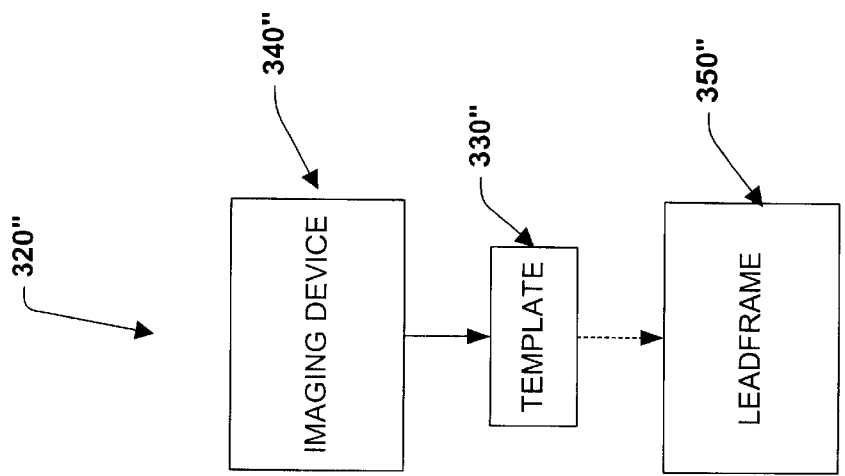
FIG. 6c is a block diagram of a leadframe inspection system in accordance with the present invention.
Figure 6B:
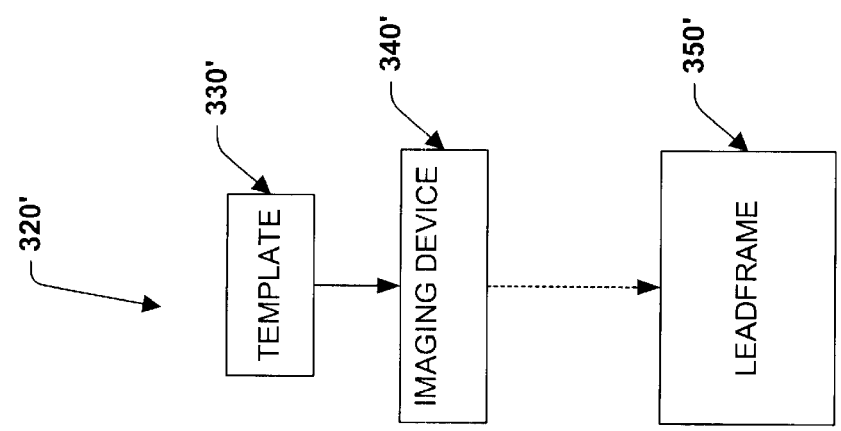
FIG. 6b is a block diagram of a leadframe inspection system in accordance with the present invention.
Figure 6A:
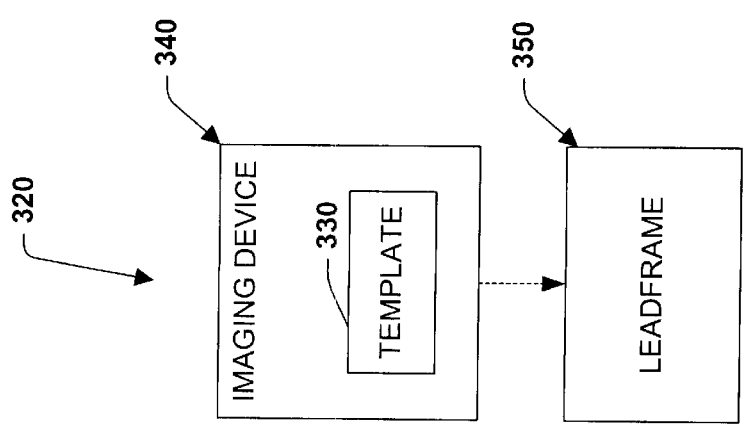
FIG. 6a is a block diagram of a leadframe inspection system in accordance with the present invention.

Referring now to FIGS. 6a, 6b, and 6c, various systems for inspecting a leadframe 320, 320', and 320'' are shown. In one aspect of the present invention, the leadframe inspection template may be integral with, or fabricated on or in the imaging device. FIG. 6a shows a leadframe inspection template 330 coupled to an imaging device 340, wherein the template 330 is contained inside of the imaging device 340. FIG. 6b shows a template 330' coupled to an imaging device 340', wherein the imaging device 340' is positioned between the leadframe to be inspected 350' and the template 330'. FIG. 6c shows a template 330'' coupled to an imaging device 340'', wherein the template 330'' is positioned between the leadframe to be inspected 350'' and the imaging device 340''.

Figure 7:
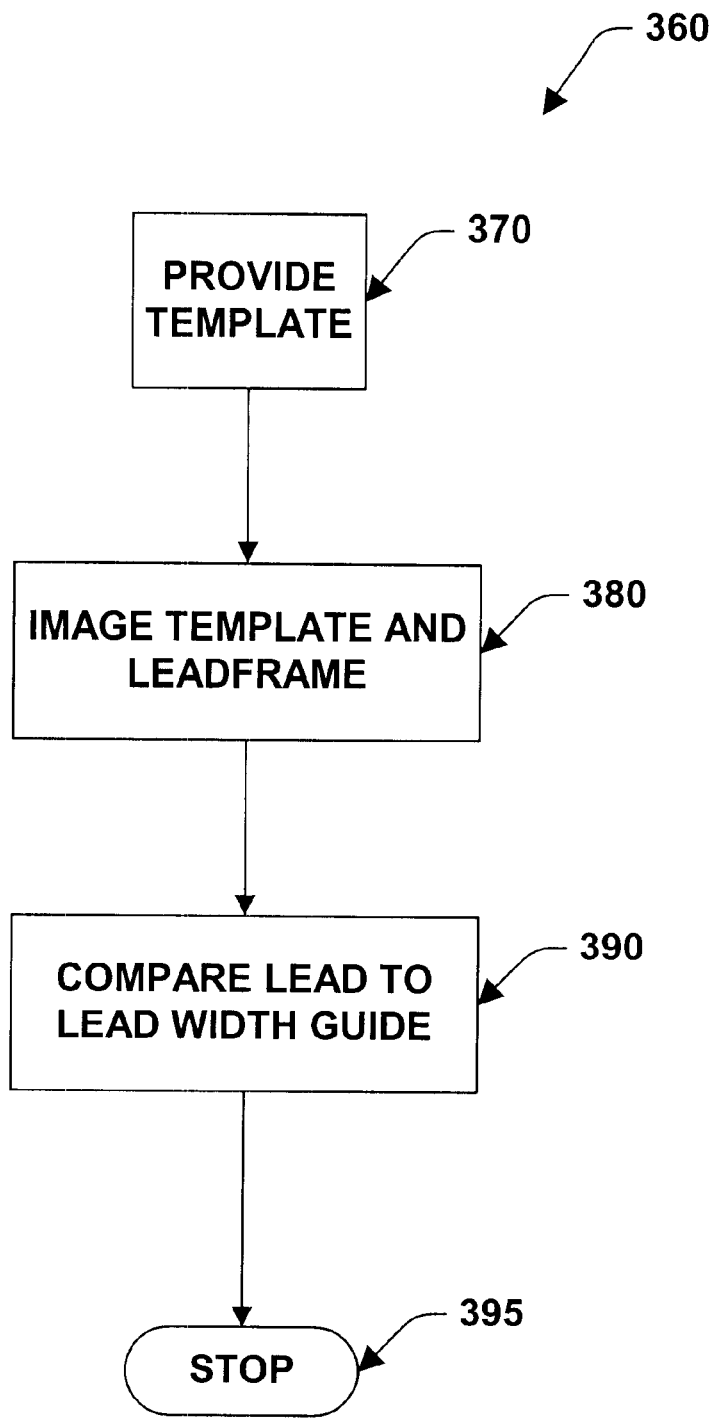
FIG. 7 is a flow chart illustrating a method of inspecting leadframes in accordance with an exemplary aspect of the present invention.

Turning now to FIG. 7, a flowchart illustrates a method 360 for inspecting a leadframe. The method begins at step 370 in which a template is provided. In one aspect of the present invention, the template has one or more lead width guides. The one or more lead width guides are formed by a first specification limit and a second specification limit. The template and one or more portions of the leadframe are imaged in step 380. Step 380 can be accomplished, for instance, by placing the leadframe on the template, aligning the leadframe with the one or more lead width guides, and imaging the template and one or more portions of the leadframe together. In step 390, one or more portions of the leadframe are compared to the one or more lead width guides. Step 390 can be accomplished by visual inspection. For example, the one or more portions of the leadframe can be visually inspected, and the width of the one or more portions can be visually compared to the width of the corresponding lead width guide. Step 390 may be automated by a computer or performed manually. This comparison can be carried out for one lead, for a plurality of leads individually, or for a plurality of leads simultaneously.

Figure 8:
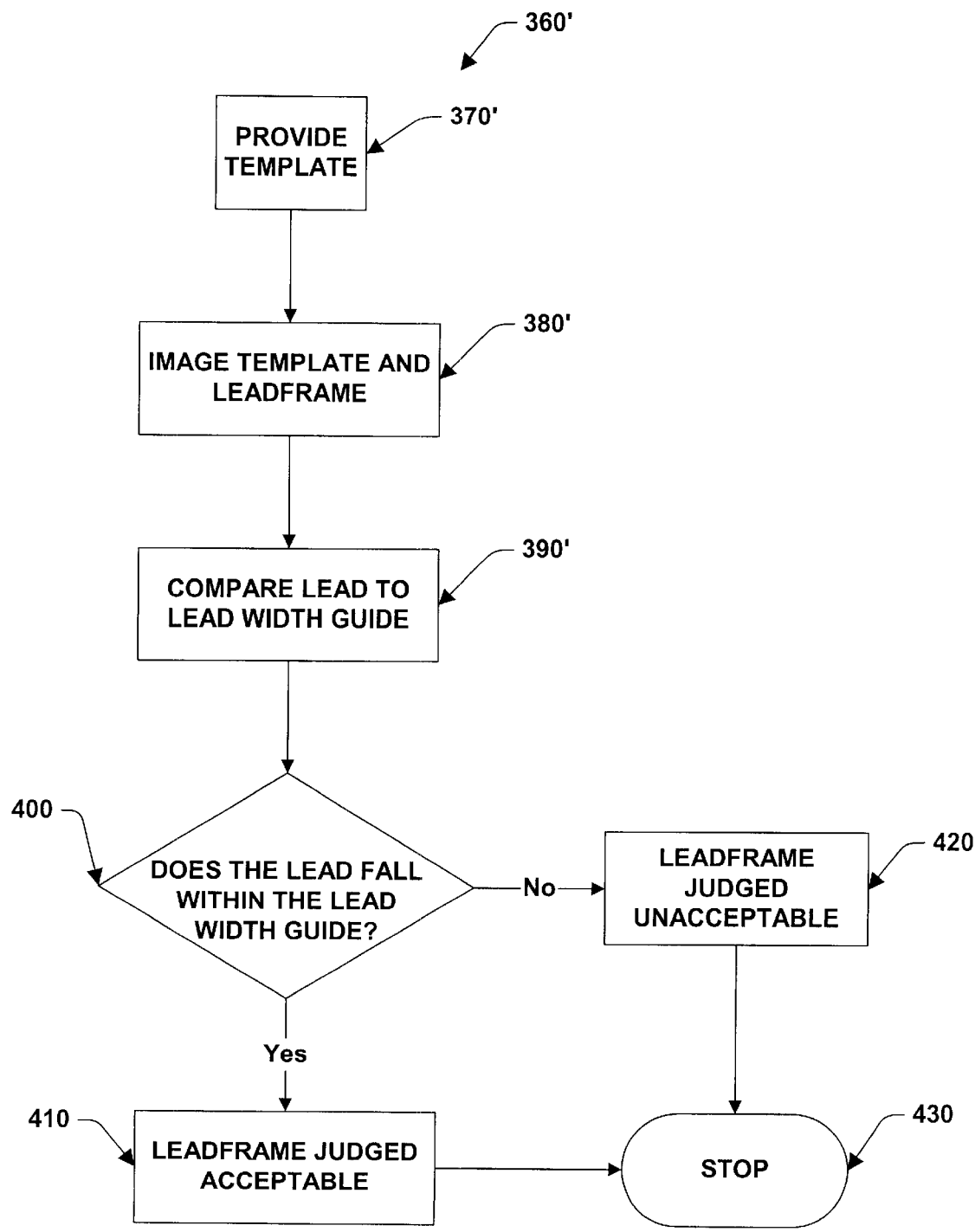
FIG. 8 is a flow chart illustrating a method of inspecting leadframes in accordance with the present invention.

In another aspect of the present invention, an additional step 400 is performed as shown in FIG. 8. In step 400, a determination is made of whether the one or more portions of the leadframe are of an acceptable width. The acceptability of the lead widths may be determined by any suitable method, such as by visually inspecting the one or more portions in relation to the lead width guide. As shown in FIG. 8, for instance, the determination may be made by visualizing if the one or more portions falls within the first and second specification limits. If the answer is in the affirmative (YES), then the leadframe is judged acceptable (step 410) and the process stops (step 430). If, however, at step 400 it is determined that the one or more portions do not fall within the first and second specification limits (NO), then the method proceeds to step 420, and the leadframe is judged unacceptable and the process stops (step 430). Step 400 may be automated by a computer or performed manually. This determination can be carried out for one lead, for a plurality of leads individually, or for a plurality of leads simultaneously.

The templates, systems, and methods of the present invention can be used to inspect the leadframes of any type of IC package. For instance, the leadframes may be those of plastic dual in-line packages (PDIP), small outline packages (SOP), plastic leaded chip carriers (PLCC), and quad flat packages (QFP), or any other type of IC packages.

Although the invention has been shown and described with respect to a certain embodiment or embodiments, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A system for inspecting a leadframe, comprising:
 a an imaging device; and
 a template coupled to the imaging device so as to produce an image of the template;
 wherein the template comprises:
  one or more lead width guides, wherein each lead width guide is formed by specification indicia associated with the template, the specification indicia consisting only of first and second specification limits, and wherein the first specification limit is positioned a first distance from the second specification limit;
  one or more alignment marks positioned a second distance from a corresponding lead width guide so as to provide a guide for aligning a portion of the leadframe with the corresponding lead width guide.

2. The system of claim 1, wherein the template comprises a substantially optically clear material with the first and second specification limits indicated by dark lines on the substantially optically clear material.

3. The system of claim 1, wherein the substantially optically clear material comprises plastic.

4. The system of claim 1, wherein the substantially optically clear material comprises glass.

5. The system of claim 1, wherein the imaging device comprises a microscope.

6. The system of claim 5, wherein the template is coupled to at least one eyepiece of the microscope.

7. The system of claim 5, wherein the microscope comprise a 3-D inspection microscope.

8. The system of claim 1, wherein the leadframe to be inspected is chosen from the group consisting of a dual in-line package, a small outline package, a plastic leaded chip carrier, and a quad flat package.

9. The system of claim 1, wherein the template comprises a plurality of lead width guides operable to inspect a corresponding plurality of unique leadframes, wherein the specification indicia and alignment marks for each of the plurality of lead width guides are unique for each corresponding unique leadframe.

* * * * *

UNITED STATES PATENT AND TRADEMARK OFFICE
CERTIFICATE OF CORRECTION

PATENT NO.   : 6,381,016 B1
DATED        : April 30, 2002
INVENTOR(S)  : Adisorn Kanjanavikat It is certified that error appears in the above-identified patent and that said Letters Patent is hereby corrected as shown below:

Column 1,
Line 3, please add the statement -- The present invention relates generally to measurement instruments, and more particularly to systems and methods for inspecting lead widths. --

Column 2,
Line 16, please delete the number "3-" and add -- 3-D --.

Column 4,
Line 27, please delete the second number "100" and replace with -- 110 --.
Line 38, please delete the number "100" and replace with -- 110 --.

Column 8,
Line 3, please delete the first word "a".
Line 11, please add the word -- and -- after the semicolon.

Signed and Sealed this

Tenth Day of September, 2002

Attest:

Attesting Officer

JAMES E. ROGAN
*Director of the United States Patent and Trademark Office*